(12) United States Patent  
Yang et al.

(10) Patent No.: US 11,698,393 B2
(45) Date of Patent: Jul. 11, 2023

(54) CURRENT DETECTION CIRCUIT FOR LOUDSPEAKER

(71) Applicant: SHANGHAI AWINIC TECHNOLOGY CO., LTD, Shanghai (CN)

(72) Inventors: Zhifei Yang, Shanghai (CN); Haijun Zhang, Shanghai (CN); Wei Yao, Shanghai (CN); Liming Du, Shanghai (CN); Jiantao Cheng, Shanghai (CN)

(73) Assignee: SHANGHAI AWINIC TECHNOLOGY CO., LTD, Shanghai (CN)

( * ) Notice: Subject to any disclaimer, the term of this patent is extended or adjusted under 35 U.S.C. 154(b) by 172 days.

(21) Appl. No.: 17/423,346

(22) PCT Filed: Jan. 13, 2020

(86) PCT No.: PCT/CN2020/071720
§ 371 (c)(1),
(2) Date: Jul. 15, 2021

(87) PCT Pub. No.: WO2020/147672
PCT Pub. Date: Jul. 23, 2020

(65) Prior Publication Data
US 2022/0082592 A1 Mar. 17, 2022

(30) Foreign Application Priority Data

Jan. 15, 2019 (CN) .......................... 201910035468.7
Jan. 15, 2019 (CN) .......................... 201910035711.5

(51) Int. Cl.
*G01R 19/00* (2006.01)
*H03F 3/217* (2006.01)
*H04R 3/00* (2006.01)

(52) U.S. Cl.
CPC ......... *G01R 19/0069* (2013.01); *H03F 3/217* (2013.01); *H04R 3/00* (2013.01)

(58) Field of Classification Search
CPC ........ H04R 3/00; H04R 3/007; H04R 29/001; G01R 19/0069; H03F 3/217; H03F 3/183; H03F 3/2173; H03F 3/2171
(Continued)

(56) References Cited

U.S. PATENT DOCUMENTS 8,660,276 B2 * 2/2014 Lin .......................... H04R 3/00
330/10
8,908,886 B2 * 12/2014 Yamauchi ........... H03F 3/45179
330/251

(Continued)

*Primary Examiner* — Xu Mei

(57) ABSTRACT

The present disclosure provides a current detection circuit for a loudspeaker 500, comprising a first detection resistor RSP, a second detection resistor RSN, a sampling selection circuit 100, an input selection circuit 200, and a processing circuit 300. By adding the sampling selection circuit 100 and the input selection circuit 200, voltages on two ends of the corresponding detection resistors (RSP, RSN) are sampled according to the fact that potential differences of an output stage VOP and an output stage VON of a class-D audio power amplifier 400 are in different semi-periods, and the current of the loudspeaker 500 is obtained through processing, thereby detecting the current of the loudspeaker 500 without adding an anti-clipping distortion function to the class-D audio power amplifier 400.

20 Claims, 9 Drawing Sheets

(58) Field of Classification Search
USPC .............. 381/55, 59, 111, 115–117, 120
See application file for complete search history.

(56) References Cited

U.S. PATENT DOCUMENTS

| | | | |
|---|---|---|---|
| 10,992,222 B2* | 4/2021 | Yang | G01R 19/10 |
| 2007/0057720 A1* | 3/2007 | Hand | H03F 3/2173 |
| | | | 330/10 |
| 2011/0012677 A1* | 1/2011 | Dooper | H03F 3/2173 |
| | | | 330/251 |
| 2019/0120883 A1* | 4/2019 | Shen | H03F 3/2173 |

* cited by examiner

CURRENT DETECTION CIRCUIT FOR LOUDSPEAKER

The present application is the U.S. national phase of International Application No. PCT/CN2020/071720, titled "CURRENT DETECTION CIRCUIT FOR LOUDSPEAKER", filed on Jan. 13, 2020, which claims priority to Chinese Patent Application No, 201910035711.5, titled "CURRENT DETECTION CIRCUIT FOR LOUDSPEAKER", filed on Jan. 15, 2019 with the China National Intellectual Property Administration, and Chinese Patent Application No. 201910035468.7, titled "CURRENT DETECTION CIRCUIT FOR LOUDSPEAKER", filed on Jan. 15, 2019 with the China National Intellectual Property Administration, all of which are incorporated herein by reference in their entirety.

FIELD

The present disclosure relates to the technical field of current detection, and in particular, to a current detection circuit for a loudspeaker.

BACKGROUND

Currently, a class-D audio power amplifier is widely used in portable devices such as a Bluetooth loudspeaker, a mobile phone and the like, for advantages of high efficiency, low heat and good performance.

An internal loudspeaker cavity of a portable device is small since the portable device is small in size. The loudspeaker cavity may be damaged due to an excessive displacement of a diaphragm or an excessively high temperature of the loudspeaker when playing music with a large volume, especially a heavy bass song with a large volume. Therefore, a current detection circuit is generally designed for the class-D audio power amplifier to control an output current of the class-D audio power amplifier according to a current of the loudspeaker, thereby protecting the loudspeaker from being damaged due to the excessive displacement of the diaphragm or the excessively high temperature of the loudspeaker. When an output power of the class-D audio power amplifier is large, the clipping phenomenon occurs, that is, a potential of an output stage VOP or a potential of an output stage VON may be continuously high or low within several pulse width modulation periods. In this case, it is difficult to detect the current of the loudspeaker accurately by using the conventional current detection method. Therefore, it is generally required that the class-D audio power amplifier be provided with a function of anti-clipping distortion, that is, the output power of the class-D audio power amplifier is limited to prevent the clipping phenomenon.

However, the output power of the class-D audio power amplifier is reduced due to the function of anti-clipping distortion, and thus the performance of the class-D audio power amplifier is not maximized.

SUMMARY

In view of this, a current detection circuit is provided according to an embodiment of the present disclosure, to improve the performance of a class-D audio power amplifier.

To achieve the above object, following technical solutions are provided according to embodiments of the present disclosure.

A current detection circuit for a loudspeaker, applied to a loudspeaker connected to a class-D audio power amplifier, including: a first detection resistor, a second detection resistor, a sampling selection circuit, an input selection circuit, and a processing circuit; where:
  one end of the first detection resistor is connected to a first input end of the input selection circuit, a connection point of the one end of the first detection resistor and the first input end of the input selection circuit is functioned as a first input end of the current detection circuit for the loudspeaker, and the one end of the first detection resistor is connected to a source of a low-end NMOS transistor of an output stage VON of the class-D audio power amplifier;
  one end of the second detection resistor is connected to a second input end of the input selection circuit, a connection point of the one end of the second detection resistor and the second input end of the input selection circuit is functioned as a second input end of the current detection circuit for the loudspeaker, and the one end of the second detection resistor is connected to a source of a low-end NMOS transistor of an output stage VOP of the class-D audio power amplifier;
  another end of the first detection resistor, another end of the second resistor, and a third input end of the input selection circuit are all connected to ground;
  a first output end of the input selection circuit is connected to a first input end of the processing circuit, and a second output end of the input selection circuit is connected to a second input end of the processing circuit;
  an output end of the processing circuit is functioned as an output end of the current detection circuit for the loudspeaker;
  three input ends of the sampling selection circuit are connected to a sampling clock, the output stage VOP, and the output stage VON respectively;
  an output end of the sampling selection circuit is connected to a switch control end of the input selection circuit; and
  the sampling selection circuit is configured to: control, when a potential difference between the output stage VOP and the output stage VON is in a positive half period, the first input end of the input selection circuit to be electrically connected with the first output end of the input selection circuit, and the third input end of the input selection circuit to be electrically connected with the second output end of the input selection circuit; and control, when the potential difference between the output stage VOP and the output stage VON is in a negative half period, the third input end of the input selection circuit to be electrically connected with the first output end of the input selection circuit, and the second input end of the input selection circuit to be electrically connected with the second output end of the input selection circuit.

In an embodiment, the input selection circuit includes: a first switch, a second switch, a third switch, a fourth switch, and a first control module; where:
  a first end of the first switch is functioned as the first input end of the input selection circuit, a first end of the second switch is functioned as the second input end of the input selection circuit, a first end of the third switch is connected to a first end of the fourth switch, and a connection point of the first end of the third switch and the first end of the fourth switch is functioned as the third input end of the input selection circuit;

a second end of the first switch is connected to a second end of the third switch, and a connection point of the second end of the first switch and the second end of the third switch is functioned as the first output end of the input selection circuit; a second end of the second switch is connected to a second end of the fourth switch, and a connection point of the second end of the second switch and the second end of the fourth switch is functioned as the second output end of the input selection circuit;

a control end of the first switch is connected to a control end of the fourth switch, and a connection point of the control end of the first switch and the control end of the fourth switch is connected to a first output end of the first control module; a control end of the second switch is connected to a control end of the third switch, and a connection point of the control end of the second switch and the control end of the third switch is connected to a second output end of the first control module; and an input end of the first control module is functioned as the switch control end of the input selection circuit.

In an embodiment, the processing circuit is configured to receive two signals outputted by the input selection circuit, sample and process a potential difference between the two signals outputted by the input selection circuit, and obtain a pulse density modulated, PDM, code.

In an embodiment, the processing circuit is configured to:
sample and process a voltage between two ends of the first detection resistor when the first input end of the input selection circuit is electrically connected with the first output end of the input selection circuit, and the third input end of the input selection circuit is electrically connected with the second output end of the input selection circuit, to obtain a first PDM code; and
sample and process a voltage between two ends of the second detection resistor when the third input end of the input selection circuit is electrically connected with the first output end of the input selection circuit, and the second input end of the input selection circuit is electrically connected with the second output end of the input selection circuit, to obtain a second PDM code.

In an embodiment, the processing circuit includes an active filter amplifier circuit and a conversion module; where:
a first input end of the active filter amplifier circuit is functioned as the first input end of the processing circuit, and a second input end of the active filter amplifier circuit is functioned as the second input end of the processing circuit;
a first output end of the active filter amplifier circuit is connected to a first input end of the conversion module, and a second output end of the active filter amplifier circuit is connected to a second input end of the conversion module; and
an output end of the conversion module is functioned as the output end of the processing circuit.

In an embodiment, the active filter amplifier circuit includes: an operational amplifier, a first input resistor, a second input resistor, a first filter branch, and a second filter branch; where:
a first end of the operational amplifier is connected to an input end of the first filter branch, a connection point of the first end of the operational amplifier and the input end of the first filter branch is connected to one end of the first input resistor; another end of the first input resistor is functioned as the first input end of the active filter amplifier circuit;

a second end of the operational amplifier is connected to an input end of the second filter branch, a connection point of the second end of the operational amplifier and the input end of the second filter branch is connected to one end of the second input resistor; another end of the second input resistor is functioned as the second input end of the active filter amplifier circuit;

a third end of the operational amplifier is connected to an output end of the first filter branch, a connection point of the third end of the operational amplifier and the output end of the first filter branch is functioned as a first output end of the active filter amplifier circuit; and a fourth end of the operational amplifier is connected to an output end of the second filter branch, a connection point of the fourth end of the operational amplifier and the output end of the second filter branch is functioned as a second output end of the active filter amplifier circuit.

In an embodiment, the first filter branch includes a first capacitor and a first feedback resistor, where the first capacitor is connected in parallel with the first feedback resistor, one end connected in parallel is functioned as the input end of the first filter branch, and another end connected in parallel is functioned as the output end of the first filter branch.

In an embodiment, the second filter branch includes a second capacitor and a second feedback resistor, where the second capacitor is connected in parallel with the second feedback resistor, one end connected in parallel is functioned as the input end of the second filter branch, and another end connected in parallel is functioned as the output end of the second filter branch.

In an embodiment, the conversion module is an integro-differential analog-to-digital converter.

In an embodiment, the first input resistor and the second input resistor have a same resistance value.

In an embodiment, the processing circuit includes: a sample-and-hold circuit, a clock control circuit, and a conversion circuit; where:
a first input end of the sample-and-hold circuit is connected to the first output end of the input selection circuit, and a second input end of the sample-and-hold circuit is connected to the second output end of the input selection circuit;
a first output end of the sample-and-hold circuit is connected to a first input end of the conversion circuit, a second output end of the sample-and-hold circuit is connected to a second input end of the conversion circuit, and a clock control end of the sample-and-hold circuit is connected to an output end of the clock control circuit; and
an output end of the conversion circuit is functioned as the output end of the processing circuit.

In an embodiment, the sample-and-hold circuit is configured to: sample a potential difference between the two output ends of the input selection circuit according to a clock control signal outputted by the clock control circuit, or to stop sampling and output the potential difference to the conversion circuit; and
the conversion circuit is configured to convert the potential difference, to obtain a PDM code.

In an embodiment, the sample-and-hold circuit is configured to: receive a clock control signal outputted by the clock control circuit; when the first input end of the input selection circuit is electrically connected with the first output end of the input selection circuit and the third input end of the input selection circuit is electrically connected with the second output end of the input selection circuit, sample a potential difference between the two ends of the first detection resistor in a case that the clock control signal received is in a high level, and stop sampling and output the potential difference to the conversion circuit in a case that the clock control signal received is in a low level; and the conversion circuit is configured to convert the potential difference, to obtain a first PDM code.

The sample-and-hold circuit is configured to: receive a clock control signal outputted by the clock control circuit; when the third input end of the input selection circuit is electrically connected with the first output end of the input selection circuit and the second input end of the input selection circuit is electrically connected with the second output end of the input selection circuit, sample a potential difference between the two ends of the second detection resistor in a case that the clock control signal received is in a high level, and stop sampling and output the potential difference to the conversion circuit in a case that the clock control signal received is in a low level; and the conversion circuit is configured to convert the potential difference, to obtain a second PDM code.

In an embodiment, the sample-and-hold circuit includes: a first switching branch, a second switching branch, a third switching branch, a fourth switching branch, a voice coil motor, a second control module, a first capacitor and a second capacitor having a same capacitance, and a third capacitor and a fourth capacitor having a same capacitance; where:

an input end of the first switching branch is connected to an input end of the third switching branch, and a connection point of the input end of the first switching branch and the input end of the third switching branch is functioned as the first input end of the sample-and-hold circuit;

an input end of the second switching branch is connected to an input end of the fourth switching branch, and a connection point of the input end of the second switching branch and the input end of the third switching branch is functioned as the second input end of the sample-and-hold circuit;

a first output end of the first switching branch is connected to one end of the third capacitor, and a connection point of the first output end of the first switching branch and the one end of the third capacitor is functioned as the first output end of the sample-and-hold circuit;

a first output end of the fourth switching branch is connected to one end of the girth capacitor, and a connection point of the first output end of the fourth switching branch and the one end of the fourth capacitor is functioned as the second output end of the sample-and-hold circuit;

another end of the third capacitor, another end of the fourth capacitor, and a positive end of the voice coil motor are all connected to ground;

a first output end of the second switching branch is connected to a first output end of the third switching branch, and a connection point of the first output end of the second switching branch and the first output end of the third switching branch is connected to a negative end of the voice coil motor;

one end of the first capacitor is connected to a second output end of the first switching branch, and another end of the first capacitor is connected to a second output end of the second switching branch;

one end of the second capacitor is connected to a second output end of the third switching branch, and another end of the second capacitor is connected to a second output end of the fourth switching branch;

a first control end of the first switching branch, a first control end of the second switching branch, a first control end of the third switching branch, and a first control end of the fourth switching branch are connected together, and then is connected to a first output end of the second control module;

a second control end of the second switching branch is connected to a second control end of the third switching branch, and a connection point of the second control end of the second switching branch and the second control end of the third switching branch is connected to a second output end of the second control module;

a second control end of the first switching branch is connected to a second control end of the fourth switching branch, and a connection point of the second control end of the first switching branch and the second control end of the fourth switching branch is connected to a third output end of the second control module; and an input end of the second control module is functioned as the clock control end of the sample-and-hold circuit.

In an embodiment, the first switching branch includes a fifth switch and a sixth switch, where an input end of the fifth switch is functioned as the input end of the first switching branch, an output end of the fifth switch is connected to an input end of the sixth switch, a connection point of the output end of the fifth switch and the input end of the sixth switch is functioned as the second output end of the first switching branch, and an output end of the sixth switch is functioned as the first output end of the first switching branch, a control end of the fifth switch is functioned as the first control end of the first switching branch, and a control end of the sixth switch is functioned as the second control end of the first switching branch.

In an embodiment, the second switching branch includes a seventh switch and an eighth switch, where an input end of the seventh switch is functioned as the input end of the second switching branch, an output end of the seventh switch is connected to an input end of the eighth switch, a connection point of the output end of the seventh switch and the input end of the eighth switch is functioned as the second output end of the second switching branch, and an output end of the eighth switch is functioned as the first output end of the second switching branch, a control end of the seventh switch is functioned as the first control end of the second switching branch, and a control end of the eighth switch is functioned as the second control end of the second switching branch.

In an embodiment, the third switching branch includes a ninth switch and a tenth switch, where an input end of the ninth switch is functioned as the input end of the third switching branch, an output end of the ninth switch is connected to an input end of the tenth switch, a connection point of the output end of the ninth switch and the input end of the tenth switch is functioned as the second output end of the third switching branch, and an output end of the tenth switch is functioned as the first output end of the third switching branch, a control end of the ninth switch is functioned as the first control end of the third switching branch, and a control end of the tenth switch is functioned as the second control end of the third switching branch.

In an embodiment, the fourth switching branch includes an eleventh switch and a twelfth switch, where an input end of the eleventh switch is functioned as the input end of the fourth switching branch, an output end of the eleventh switch is connected to an input end of the twelfth switch, a connection point of the output end of the eleventh switch and the input end of the twelfth switch is functioned as the second output end of the fourth switching branch, and an output end of the twelfth switch is functioned as the first output end of the fourth switching branch, a control end of the eleventh switch is functioned as the first control end of the fourth switching branch, and a control end of the twelfth switch is functioned as the second control end of the fourth switching branch.

In an embodiment, the clock control circuit includes: a second sampling clock, a first counter, a second counter, and a third counter; where:

an output end of the second sampling clock is functioned as the output end of the clock control circuit, a first input end of the second sampling clock is connected to the first counter, a second input end of the second sampling clock is connected to the second counter, and a third input end of the second sampling clock is connected to the third counter.

In an embodiment, the conversion circuit is an integro-differential analog-to-digital converter.

In an embodiment, the first detection resistor and the second detection resistor have a same resistance value.

In an embodiment, a frequency of the sampling clock is 256 times a pulse width modulation frequency of a potential of the output stage VOP and a potential of the output stage VON.

In an embodiment, the current detection circuit for a loudspeaker further includes a cascaded integrator-comb, CIC, filter, where the CIC filter is configured to: convert a signal outputted by the processing circuit, to obtain a sampled voltage value, and calculate a current value on the loudspeaker based on the sampled voltage value.

Compared with the prior art, according to embodiments of the present disclosure, the sampling selection circuit and the input selection circuit are added. Potential differences between two ends of corresponding detection resistor are sampled when the potential difference between the output stage VOP and output stage VON of the class-D audio power amplifier is in a positive half cycle or a negative half cycle. The potential differences are processed, and the current of the loudspeaker is obtained, and thus the detection of the current of the loudspeaker is realized. In addition, the anti-clipping distortion function is not required for the class-D audio power amplifier, thereby ensuring the performance of the class-D audio power amplifier.

DETAILED DESCRIPTION OF EMBODIMENTS

In order to illustrate technical solutions in embodiments of the present disclosure, preferred embodiments of the present disclosure are introduced hereinafter. The description is merely to illustrate the features and advantages of the present disclosure, and is not intended to limit the claims of the present disclosure.

Figure 1:
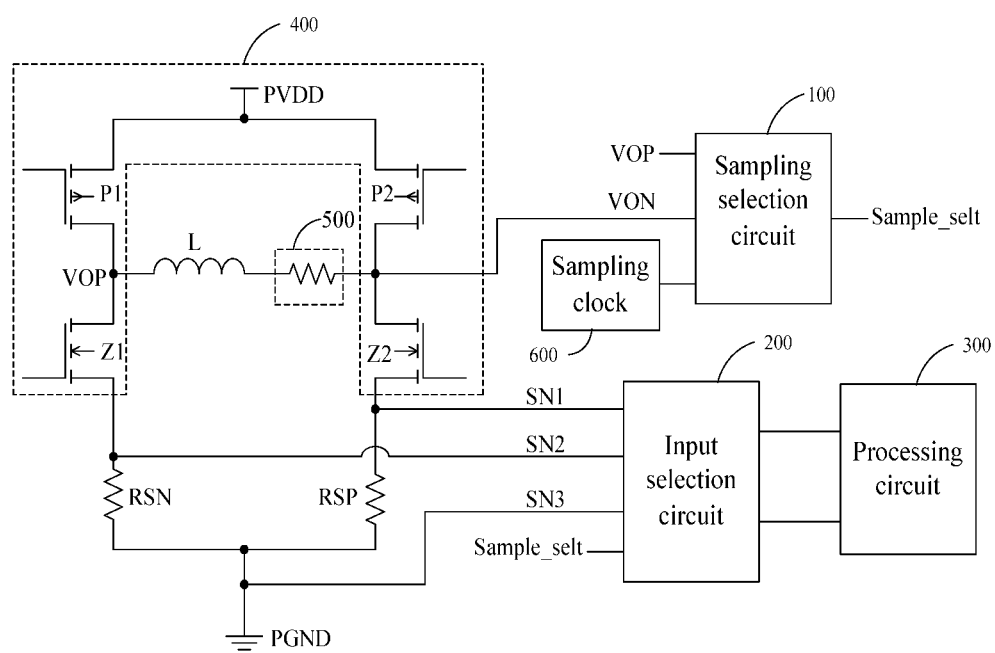
FIG. 1 is a schematic diagram of a current detection circuit according to an embodiment of the present disclosure.

To improve the performance of a class-D audio power amplifier, a current detection circuit for a loudspeaker applied to a class-D audio power amplifier is provided according to an embodiment of the present disclosure. Referring to FIG. 1, the current detection circuit is connected to a class-D audio power amplifier 400 and a loudspeaker 500. An inductance L may also be connected in series to a branch of the loudspeaker 500, which depends on actual situations. The current detection circuit includes: a first detection resistor RSP, a second detection resistor RSN, a sampling selection circuit 100, an input selection circuit 200, and a processing circuit 300.

One end of the first detection resistor RSP is connected to a first input end SN1 of the input selection circuit 200, a connection point of the one end of the first detection resistor and the first input end of the input selection circuit is functioned as a first input end of the current detection circuit of the class-D audio power amplifier 400. The one end of the first detection resistor RSP is connected to a source of a low-end NMOS transistor Z2 of an output stage VON of the class-D audio power amplifier 400.

One end of the second detection resistor RSN is connected to a second input end SN2 of the input selection circuit 200, a connection point of the one end of the second detection resistor and the second input end of the input selection circuit is functioned as a second input end of the current detection circuit of the class-D audio power amplifier 400. The one end of the second detection resistor RSN is connected to a source of a low-end NMOS transistor Z1 of an output stage VOP of the class-D audio power amplifier.

The first detection resistor RSP and the second detection resistor RSN have a same resistance value.

Another end of the first detection resistor RSP, another end of the second resistor RSN, and a third input end SN3 of the input selection circuit are all connected to ground.

A first output end of the input selection circuit 200 is connected to a first input end of the processing circuit 300, and a second output end of the input selection circuit 200 is connected to a second input end of the processing circuit 300.

An output end of the processing circuit 300 is functioned as an output end of the current detection circuit for the loudspeaker.

Three input ends of the sampling selection circuit 100 are connected to a sampling clock 600, the output stage VOP, and the output stage VON respectively.

The sampling selection circuit 100 is configured to: control the first input end of the input selection circuit 200 to be electrically connected with the first output end of the input selection circuit 200, and the third input end of the input selection circuit 200 to be electrically connected with the second output end of the input selection circuit 200 through a switching control signal Switch_selt when a potential difference between the output stage VOP and the output stage VON is in a positive half period; and control the third input end of the input selection circuit 200 to be electrically connected with the first output end of the input selection circuit 200, and the second input end of the input selection circuit 200 to be electrically connected with the second output end of the input selection circuit 200 through the switching control signal Switch_selt when the potential difference between the output stage VOP and the output stage VON is in a negative half period.

The processing circuit 300 is configured to: receive two signals outputted by the input selection circuit 200, sample and process a potential difference between the two signals outputted by the input selection circuit, and obtain a pulse density modulated (PDM) code. Specifically, when the first input end of the input selection circuit 200 is electrically connected with the first output end of the input selection circuit 200, and the third input end of the input selection circuit 200 is electrically connected with the second output end of the input selection circuit 200, the processing circuit 300 is configured to sample and process a potential difference between the two ends of the first detection resistor RSP, to obtain a first PDM code. When the third input end of the input selection circuit 200 is electrically connected with the first output end of the input selection circuit 200, and the second input end of the input selection circuit 200 is electrically connected with the second output end of the input selection circuit 200, the processing circuit 300 is configured to sample and process a potential difference between the two ends of the second detection resistor RSN, to obtain a second PDM code.

In one embodiment, a frequency of the sampling clock 600 is 256 times a pulse width modulation frequency of a potential of the output stage VOP and a potential of the output stage. VON, and other settings may be selected depending on specific practical applications, which is only one example, and is not limited thereto, all of which fall within the scope of the present disclosure.

An output end of the sampling selection circuit 100 is connected to a switch control end of the input selection circuit 200.

The specific working principle is described as follows.

The sampling selection circuit 100 obtains a waveform after a VOP–VON filtering process based on the potential of the output stage VOP and the potential of the output stage VON. For example, the waveform of a sine wave is shown in the upper part of FIG. 2. Based on the frequency of the sampling clock 600, the sampling selection circuit 100 determines whether the potential difference between the output stage VOP and the output stage VON (that is, the value after the VOP–VON filtering process) is in a positive half cycle or a negative half cycle, and outputs a corresponding switch control signal Switch_selt.

Figure 2:
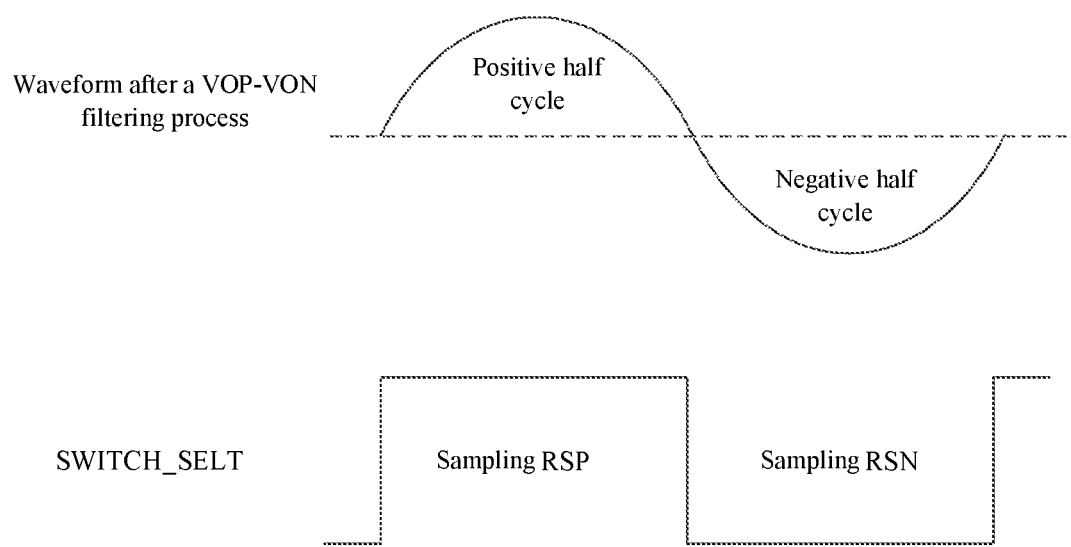
FIG. 2 is a waveform diagram of a switching control signal Switch_selt during a positive cycle and a negative half cycle according to an embodiment of the present disclosure.

Referring to FIG. 2, if the potential difference between the output stage VOP and the output stage VON is within a positive half cycle, the switching control signal Switch_selt outputted by the sampling selection circuit 100 is in a certain level, for example, in a high level. The first input end SN1 of the input selection circuit 200 is controlled to be electrically connected with the first output end of the input selection circuit 200, and the third input end SN3 of the input selection circuit 200 is controlled to be electrically connected with the second output end of the input selection circuit 200 based on the switching control signal Switch_selt. Thus the processing circuit 300 samples and processes the potential difference between the two ends of the first detection resistor RSP, to obtain the first PDM code.

If the potential difference between the output stage VOP and the output stage VON is within a negative half cycle, the switching control signal Switch_selt outputted by the sampling selection circuit 100 is in another level, for example, in a low level. The third input end SN3 of the input selection circuit 200 is controlled to be electrically connected with the first output end of the input selection circuit 200, and the second input end SN2 of the input selection circuit 200 is controlled to be electrically connected with the second output end of the input selection circuit 200 based on the switching control signal Switch_selt. Thus the processing circuit 300 samples and processes the potential difference between the two ends of the second detection resistor RSN, to obtain the second PDM code.

The PDM codes, such as the first PDM code and the second PDM code, are passed through a cascaded integrator-comb (CIC) filter to obtain a current of the loudspeaker. It should be noted that, the current of the loudspeaker may also be obtained based on other information such as a full range current value (Ifullscale) after obtaining the PDM code.

In one embodiment, the current detection circuit may include a CIC filter. The CIC filter is configured to: convert the signal outputted by the processing circuit, that is, the PDM code including the first PDM code and the second PDM code, to obtain a sampled voltage value Vsdm, and calculate the current of the loudspeaker according to a formula of Vsdm/(2*RSP).

According to the embodiments of the present disclosure, the sampling selection circuit and the input selection circuit are added. Potential differences between two ends of corresponding detection resistor are sampled when the potential difference between the output stage VOP and the output stage VON of the class-D audio power amplifier is in a positive half cycle or a negative half cycle. The potential differences are processed, and the current of the loudspeaker is obtained, and thus the detection of the current of the loudspeaker is realized. In addition, the anti-clipping distortion function is not required for the class-D audio power amplifier, thereby ensuring the performance of the class-D audio power amplifier.

Figure 3:
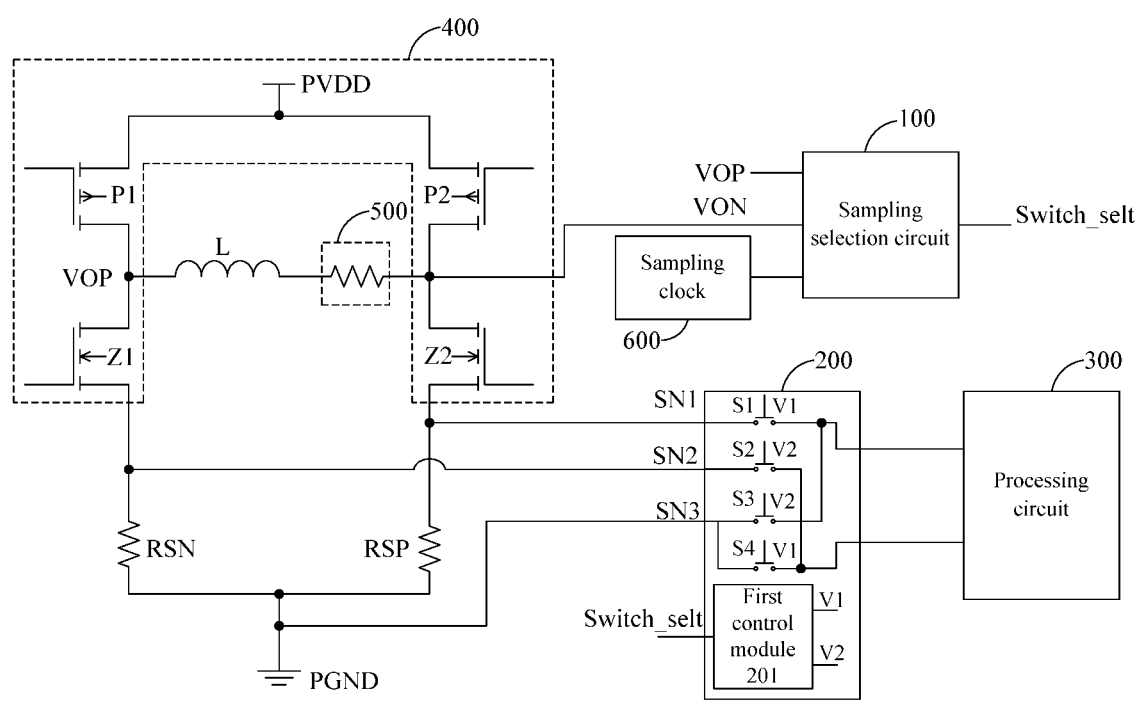
FIG. 3 is a schematic diagram of a current detection circuit according to an embodiment of the present disclosure.

A current detection circuit for a loudspeaker is provided according to an embodiment of the present disclosure. Based on the aforementioned embodiments as shown in FIGS. 1 and 2, the input selection circuit 200 may include: a first switch S1, a second switch S2, a third switch S3, a fourth switch S4, and a first control module 201 in one embodiment, which is shown in FIG. 3. A first end of the first switch S1 is functioned as the first input end SN1 of the input selection circuit 200, a first end of the second switch S2 is functioned as the second input end SN2 of the input selection circuit 200, a first end of the third switch S3 or a first end of the fourth switch S4 is functioned as the third input end SN3 of the input selection circuit 200. A second end of the first switch S1 is connected to a second end of the third switch S3, and a connection point of the second end of the first switch and the second end of the third switch is functioned as the first output end of the input selection circuit 200. A second end of the second switch S2 is connected to a second end of the fourth switch S4, and a connection point of the second end of the second switch and the second end of the fourth switch is functioned as the second output end of the input selection circuit 200. A control end of the first switch S1 is connected to a control end of the fourth switch S4, and a connection point of the control end of the first switch and the control end of the fourth switch is connected to a first output end of the first control module 201. A control end of the second switch S2 is connected to a control end of the third switch S3, and a connection point of the control end of the second switch and the control end of the third switch is connected to a second output end of the first control module 201. An input end of the first control module 201 is functioned as the switch control end of the input selection circuit 200.

The specific working principle is illustrated as follows.

If the potential difference between the output stage VOP and the output stage VON is in a positive half cycle, that is, the switching control signal Switch_selt received by the switch control end of the input selection circuit 200 is in a high level, a turn-on signal is outputted through the first output end V1 of the first control module 201, to control the first switch S1 and the fourth switch S4 to close; and a turn-off signal is outputted through the second output end V2 of the first control module 201, to control the second switch S2 and the third switch S3 to turn off.

If the potential difference between the output stage VOP and the output stage VON is in a negative half cycle, that is, the switching control signal Switch_selt received by the switch control end of the input selection circuit 200 is in a low level, a turn-off signal is outputted through the first output end V1 of the first control module 201, to control the first switch S1 and the fourth switch S4 to turn off; and a turn-on signal is outputted through the second output end V2 of the first control module 201, to control the second switch S2 and the third switch S3 to close.

A specific embodiment of the input selection circuit 200 is provided but is not limited by the present disclosure. A circuit structure or a chip composed of other discrete devices may be selected in practical applications, depending on a specific application environment, and any solution capable of implementing the aforementioned working principle is within the scope of the present disclosure.

The structure and principle of the input selection circuit 200 in the embodiment are similar to those in the aforementioned embodiments, which will not be described again herein for simplicity.

Figure 4:
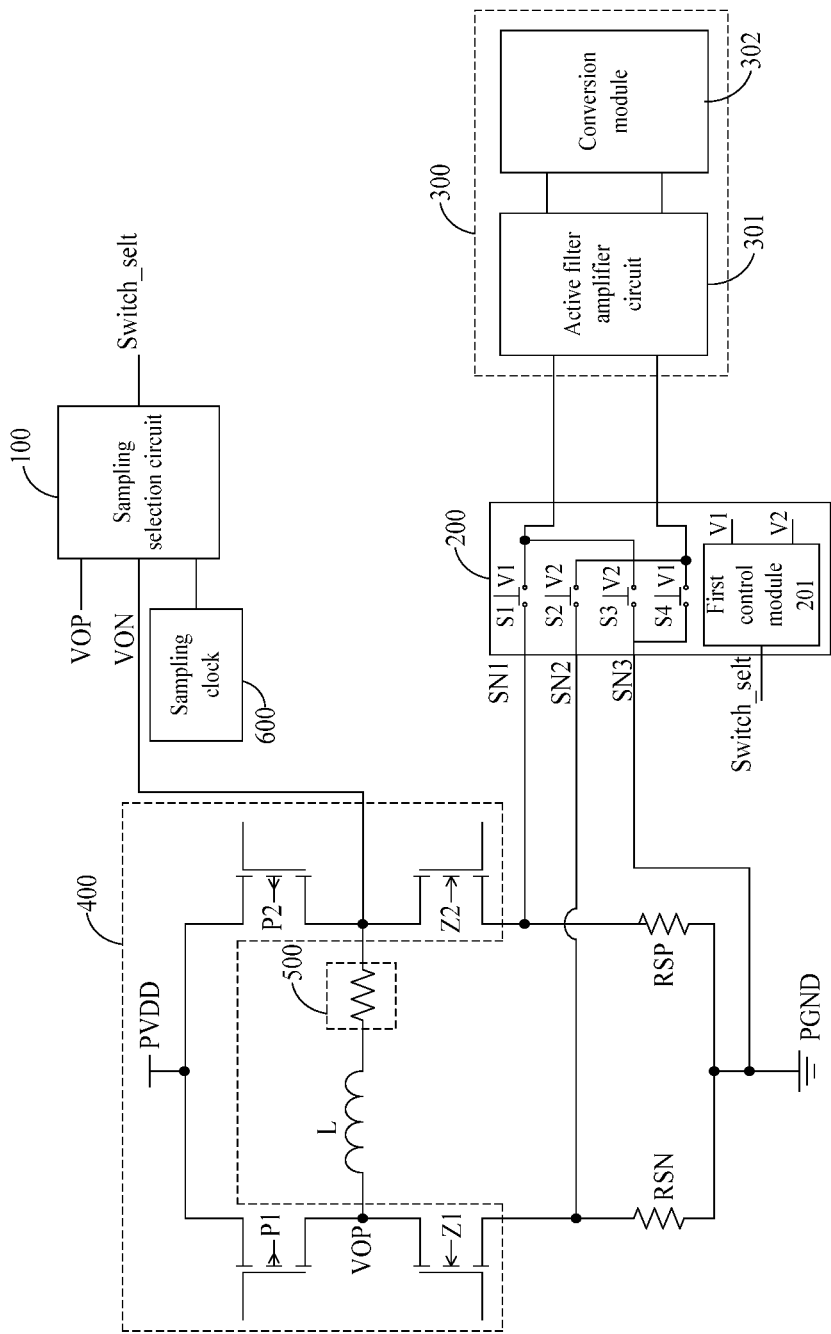
FIG. 4 is a schematic diagram of a current detection circuit according to an embodiment of the present disclosure.

In one embodiment, as shown in FIG. 4, the processing circuit 300 includes an active filter amplifier circuit 301 and a conversion module 302. A first input end of the active filter amplifier circuit 301 is functioned as the first input end of the processing circuit 300, and a second input end of the active filter amplifier circuit 301 is functioned as the second input end of the processing circuit 300. A first output end of the active filter amplifier circuit 301 is connected to a first input end of the conversion module 302, and a second output end of the active filter amplifier circuit 301 is connected to a second input end of the conversion module 302. An output end of the conversion module 302 is functioned as the output end of the processing circuit 300.

The active filter amplifier circuit 301 is configured to sample a potential difference between two signals outputted by the input selection circuit 200, and perform an active filtering process and a gain amplification process on the potential difference.

The conversion module 302 is configured to convert a voltage processed by the active filter amplifier circuit 301, to obtain a PDM code.

In one embodiment, the conversion module 302 is an integro-differential analog-to-digital converter.

The specific working principle is illustrated as follows.

If the potential difference between the output stage VOP and the output stage VON is in a positive half cycle, that is, the switching control signal Switch_selt received by the input selection circuit 200 is in a high level, the active filter amplifier circuit 301 samples a potential difference between two ends of the first detection resistor RSP, and performs an active filtering process and a gain amplification process on the potential difference. The conversion module 302 converts the processed potential difference, to obtain a first PDM code.

If the potential difference between the output stage VOP and the output stage VON is in a negative half cycle, that is, the switching control signal Switch_selt received by the input selection circuit 200 is in a low level, the active filter amplifier circuit 301 samples a potential difference between two ends of the second detection resistor RSN of the class-D audio power amplifier, and performs an active filtering process and a gain amplification process on the potential difference. The conversion module 302 converts the processed potential difference, to obtain a second PDM code.

A specific embodiment of the processing circuit 300 is provided but is not limited by the present disclosure. Other filtering circuits, for example, a passive filtering circuit, may be selected in practical applications, as long as a corresponding filtering function can be realized. The conversion circuit 302 is not limited to the integro-differential analog-to-digital converter, and other circuits composed of discrete devices that are capable of realizing a gain amplification function may also be selected, depending on a specific application environment, and all of which are within the scope of the present disclosure.

The structure and principle of the conversion circuit 300 in the embodiment are similar to those in the aforementioned embodiments, which will not be described again herein for simplicity.

Figure 5:
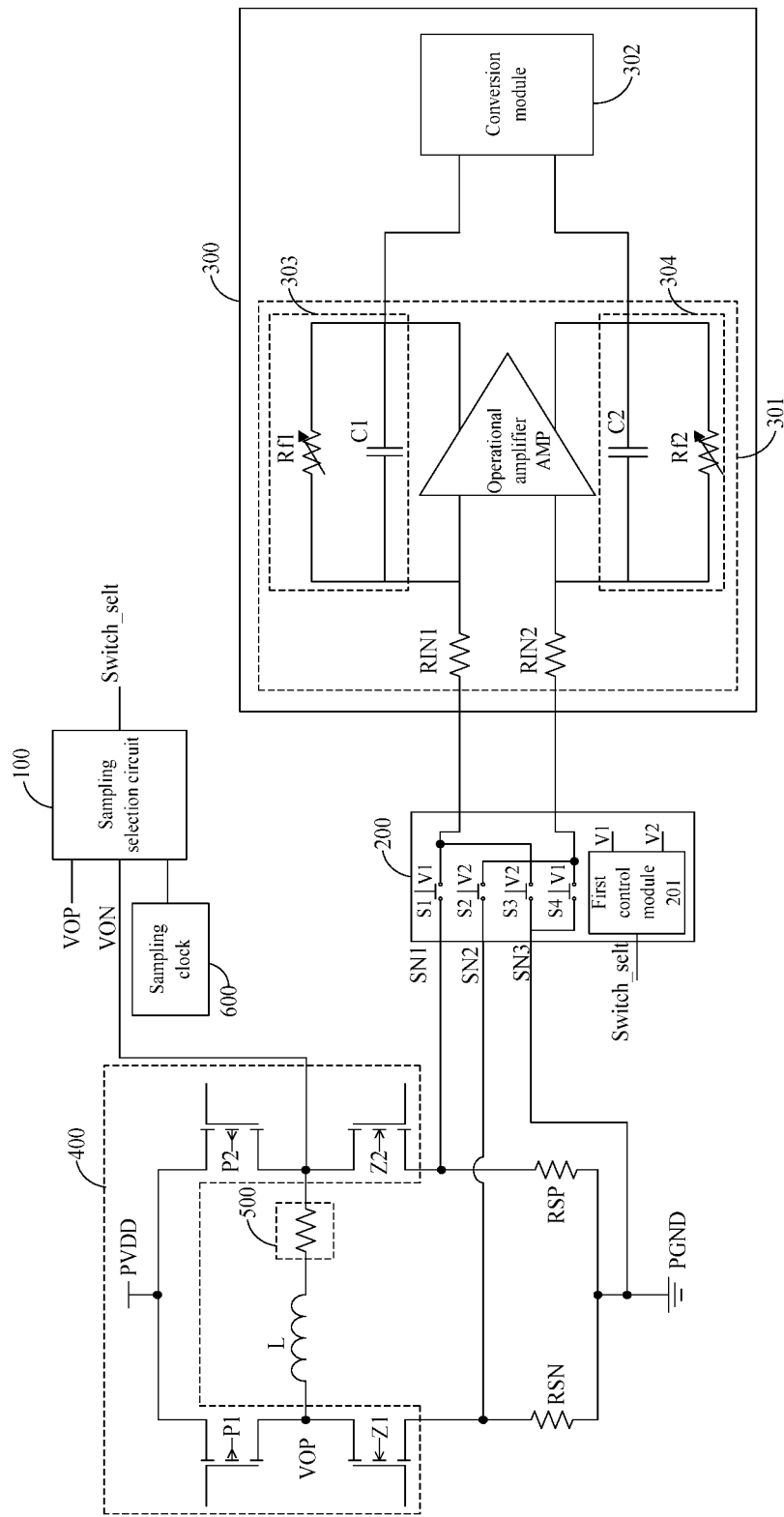
FIG. 5 is a schematic diagram of a current detection circuit according to an embodiment of the present disclosure.

In one embodiment as shown in FIG. 5, the active filter amplifier circuit 301 includes: an operational amplifier AMP, a first input resistor RIN1, a second input resistor RIN2, a first filter branch 303, and a second filter branch 304. A first end of the operational amplifier AMP is connected to an input end of the first filter branch 303, a connection point of the first end of the operational amplifier and the input end of the first filter branch is connected to one end of the first input resistor RIN1; and another end of the first input resistor RIN1 is functioned as the first input end of the active filter amplifier circuit 301. A second end of the operational amplifier AMP is connected to an input end of the second filter branch 304, a connection point of the second end of the operational amplifier and the input end of the second filter branch is connected to one end of the second input resistor RIN2; and another end of the second input resistor RIN2 is functioned as the second input end of the active filter amplifier circuit 301. A third end of the operational amplifier AMP is connected to an output end of the first filter branch 303, and a connection point of the third end of the operational amplifier and the output end of the first filter branch is functioned as a first output end of the active filter amplifier circuit 301. A fourth end of the operational amplifier AMP is connected to an output end of the second filter branch 304, and a connection point of the fourth end of the operational amplifier and the output end of the second filter branch is functioned as a second output end of the active filter amplifier circuit 301.

In an embodiment, the first filter branch 303 includes a first capacitor C1 and a first feedback resistor Rf1. The first capacitor C1 is connected in parallel with the first feedback resistor Rf1, one end connected in parallel is functioned as the input end of the first filter branch 303, and another end connected in parallel is functioned as the output end of the first filter branch 303.

In an embodiment, the second filter branch 304 includes a second capacitor C2 and a second feedback resistor Rf2. The second capacitor C2 is connected in parallel with the second feedback resistor Rf2, one end connected in parallel is functioned as the input end of the second filter branch 304, and another end connected in parallel is functioned as the output end of the second filter branch 304.

The first input resistor RIN1 and the second input resistor RIN2 have a same resistance value.

The specific working principle is illustrated as follows.

The first input resistor RIN1, the operational amplifier AMP, and the first feedback resistor Rf1 form a positive feedback circuit configured to gain amplify a voltage at the first input end of the active filter amplifier circuit 301, and the amplification factor is calculated according to a formula: AV=−Rf1/RIN1.

The first capacitor C1 in the first filter branch 303 and the second capacitor C2 in the second filter branch 304 function as a low-pass filter for a voltage at the first output end the active filter amplifier circuit 301 and a voltage at the second output end of the active filter amplifier circuit 301, to filter out high-frequency components in the potential of the output stage VOP and the potential of the output stage VON of the class-D audio power amplifier 400. Thus the high-frequency noise is prevented from being folded into the audio range to reduce the signal-to-noise ratio of current detection. The −3 dB frequency of the active filter amplifier circuit 301 is calculated according to a formula:

$$f(-3\ dB)=1/(2\times\pi\times R_{f1}\times C1).$$

A specific embodiment of the active filter amplifier circuit 301 is provided but is not limited by the present disclosure. Other filtering circuits may be selected in practical applications, as long as a corresponding low pass filtering function can be realized, and all of which are within the scope of the present disclosure.

The structure and principle of the active filter amplifier circuit 301 in the embodiment are similar to those in the aforementioned embodiments, which will not be described again herein for simplicity.

Figure 6:
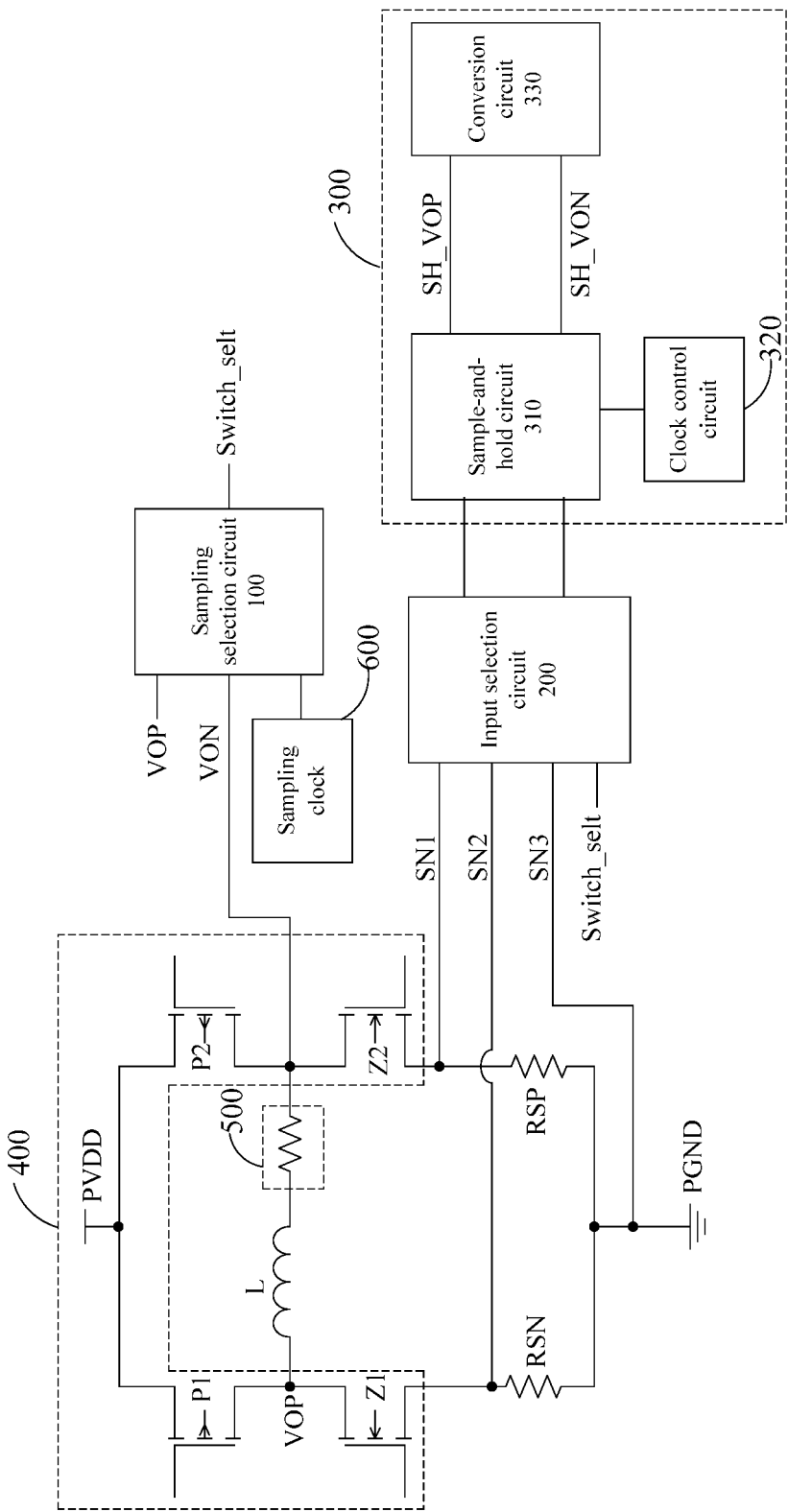
FIG. 6 is a schematic diagram of a current detection device according to an embodiment of the present disclosure.

On the basis of the embodiments as shown in FIGS. 1 to 3, a specific implementation of the processing circuit 300 is provided according to an embodiment of the present disclosure. Referring to FIG. 6, the processing circuit 300 includes: a sample-and-hold circuit 310, a clock control circuit 320, and a conversion circuit 330. A first input end of the sample-and-hold circuit 310 is connected to the first output end of the input selection circuit 200, and a second input end of the sample-and-hold circuit 310 is connected to the second output end of the input selection circuit 200. A first output end of the sample-and-hold circuit 310 is connected to a first input end of the conversion circuit 330, a second output end of the sample-and-hold circuit 310 is connected to a second input end of the conversion circuit 330, and a clock control end of the sample-and-hold circuit 310 is connected to an output end of the clock control circuit 320. An output end of the conversion circuit 330 is functioned as the output end of the processing circuit 300.

The sample-and-hold circuit 310 is configured to: sample a potential difference between the two output ends of the input selection circuit 200 according to a clock control signal outputted by the clock control circuit 320, or to stop sampling and output the potential difference to the conversion circuit 330. The conversion circuit 330 is configured to convert the potential difference, to obtain a PDM code.

The sample-and-hold circuit 310 receives a clock control signal outputted by the clock control circuit 320. When the first input end of the input selection circuit 200 is electrically connected with the first output end of the input selection circuit 200 and the third input end of the input selection circuit 200 is electrically connected with the second output end of the input selection circuit 200, the sample-and-hold circuit 310 samples a potential difference between the two ends of the first detection resistor RSP in a case that the clock control signal received is in a high level, and the sample-and-hold circuit 310 stops sampling and outputs the potential difference to the conversion circuit 330 in a case that the clock control signal received is in a low level. The conversion circuit 330 converts the potential difference, to obtain a first PDM code.

When the third input end of the input selection circuit 200 is electrically connected with the first output end of the input selection circuit 200 and the second input end of the input selection circuit 200 is electrically connected with the second output end of the input selection circuit 200, the sample-and-hold circuit 310 samples a potential difference between the two ends of the second detection resistor RSN in a case that the clock control signal received is in a high level, and the sample-and-hold circuit 310 stops sampling and outputs the potential difference to the conversion circuit 330 in a case that the clock control signal received is in a low level. The conversion circuit 330 converts the potential difference, to obtain a second PDM code.

The conversion circuit 330 may be an integro-differential analog-to-digital converter, and may also be other circuits composed of discrete devices that are capable of realizing a gain amplification function, depending on a specific application environment in practical applications, and all of which are within the scope of the present disclosure.

The sample-and-hold circuit 310 has a function of low pass filtering, and is configured to filter out high-frequency components in the potential of the output stage VOP and the potential of the output stage VON, and then send the potential to a conversion module 800. Thus the high-frequency noise is prevented from being folded into the audio range to reduce the signal-to-noise ratio of current detection. The −3 dB frequency of the sample-and-hold circuit 310 is calculated according to a formula:

$$f(-3\ dB)=(fsw*C1)/(2*\pi*(C1+C3));$$

where fsw is a frequency of a transistor in the sample-and-hold circuit 310.

The specific working principle is illustrated as follows.

The sample-and-hold circuit 310 obtains a waveform after a VOP−VON filtering process based on the potential of the output stage VOP and the potential of the output stage VON. For example, the waveform of a sine wave is shown in the upper part of FIG. 2. Based on the frequency of a first sampling clock 400, the sampling selection circuit 100 determines whether the potential difference between the output stage VOP and the output stage VON (that is, the value after the VOP−VON filtering process) is in a positive half cycle or a negative half cycle, and outputs a corresponding switch control signal Switch_selt.

Referring to FIG. 2, if the potential difference between the output stage VOP and the output stage VON is within a positive half cycle, the switching control signal Switch_selt outputted by the sampling selection circuit 100 is in a high level. The first input end SN1 of the input selection circuit 200 is electrically connected with the first output end of the input selection circuit 200, and the third input end SN3 of the input selection circuit 200 is electrically connected with the second output end of the input selection circuit 200. The sample-and-hold circuit 310 samples the potential difference between the two ends of the first detection resistor RSP in a case that the clock control signal received by the clock control end of the sample-and-hold circuit 310 is in a high level, and the sample-and-hold circuit 310 stops sampling and outputs the potential difference to the conversion circuit 330 in a case that the clock control signal received by the clock control end of the sample-and-hold circuit 310 is in a low level. The conversion circuit 330 converts the potential difference, to obtain the first PDM code. The above process is repeated until the potential of the switch control signal Switch_selt becomes low.

If the potential difference between the output stage VOP and the output stage VON is within a negative half cycle, the switching control signal Switch_selt outputted by the sampling selection circuit 100 is in a low level. The third input end SN3 of the input selection circuit 200 is electrically connected with the first output end of the input selection circuit 200, and the second input end SN2 of the input selection circuit 200 is electrically connected with the second output end of the input selection circuit 200. The sample-and-hold circuit 310 samples the potential difference between the two ends of the second detection resistor RSN in a case that the clock control signal received by the clock control end of the sample-and-hold circuit 310 is in a high level, and the sample-and-hold circuit 310 stops sampling and outputs the potential difference to the conversion circuit 330 in a case that the clock control signal received by the clock control end of the sample-and-hold circuit 310 is in a low level. The conversion circuit 330 converts the potential difference, to obtain the second PDM code. The above process is repeated until the potential of the switch control signal Switch_selt becomes high.

The first PDM code and the second PDM code obtained in the above process are converted by a CIC filter, to obtain a sampled voltage value Vsdm, and the current on the loudspeaker is calculated according to a formula of Vsdm/(2*RSP). The current on the loudspeaker is obtained for loudspeaker protection.

According to this embodiment, the clock control circuit 320 controls the sample-and-hold circuit 310 to start sampling or stop sampling based on different levels of the clock control signal. Other embodiments that achieve the same purpose as this embodiment are also within the scope of the present disclosure.

According to the embodiment of the present disclosure, the sampling selection circuit and the input selection circuit are used. Potential differences between two ends of corresponding detection resistor are sampled when the potential difference between the output stage VOP and the output stage VON of the class-D audio power amplifier is in a positive half cycle or a negative half cycle. The process of sampling or stopping sampling the potential differences between two ends of corresponding detection resistor and outputting the sampled voltage is selected based on the levels of the clock control signal outputted by the clock control circuit. Thus the detection of the current of the loudspeaker is realized. In addition, the anti-clipping distortion function is not required for the class-D audio power amplifier, thereby ensuring the performance of the class-D audio power amplifier. Further, since the sample-and-hold circuit according to the embodiment of the present disclosure is in a structure of full differential input and full differential output, thereby avoiding the influence of the voltage fluctuation of the power ground PGND on the accuracy of the sampling voltage.

Figure 7:
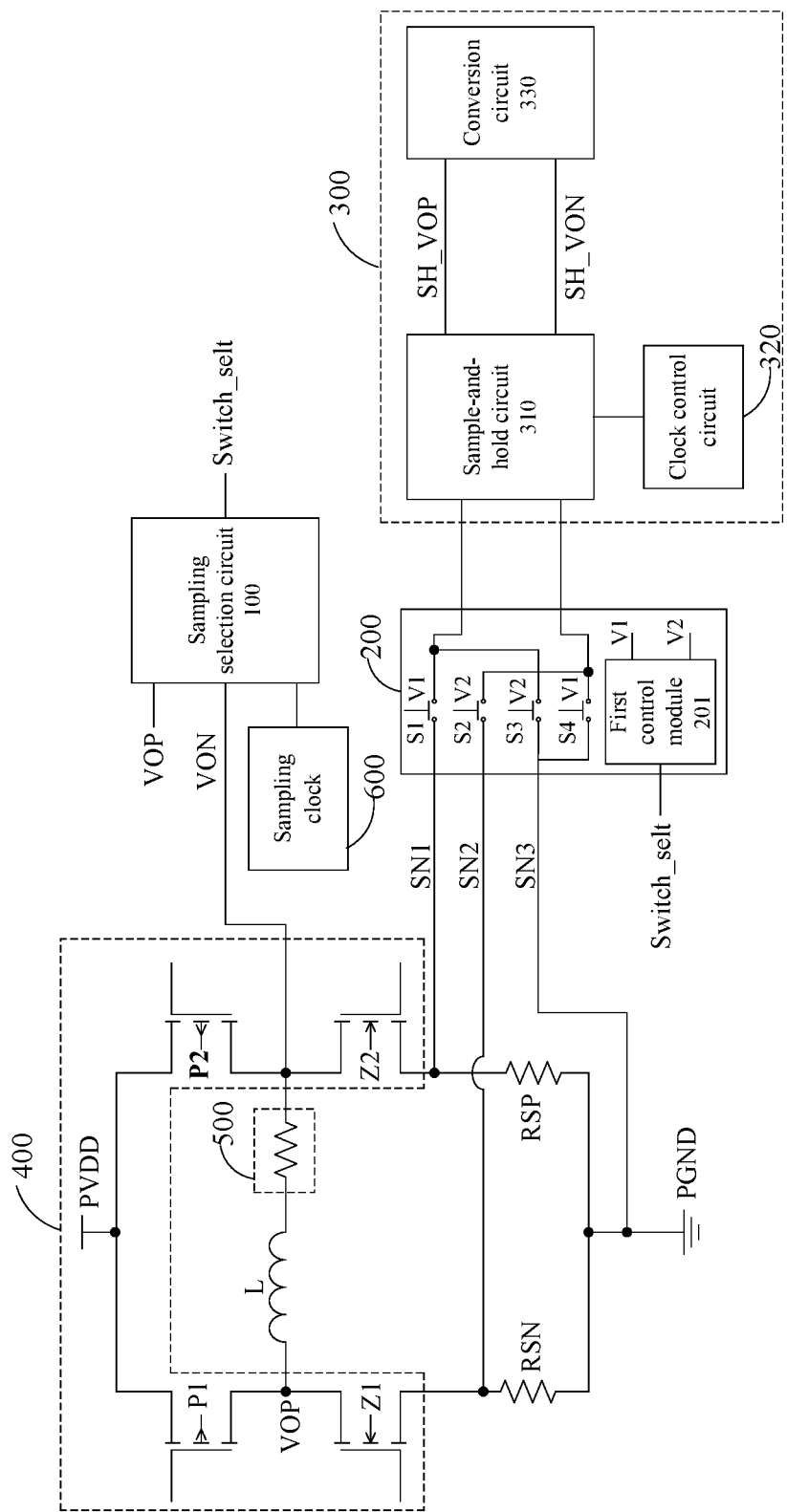
FIG. 7 is a schematic diagram of a current detection device according to an embodiment of the present disclosure.

In an embodiment, as shown in FIG. 7, the input selection circuit 200 may include: a first switch S1, a second switch S2, a third switch S3 a fourth switch S4, and a first control module 201; the structure and principle thereof are similar to those in the embodiment as shown in FIG. 3, which will not be described again herein.

Figure 8:
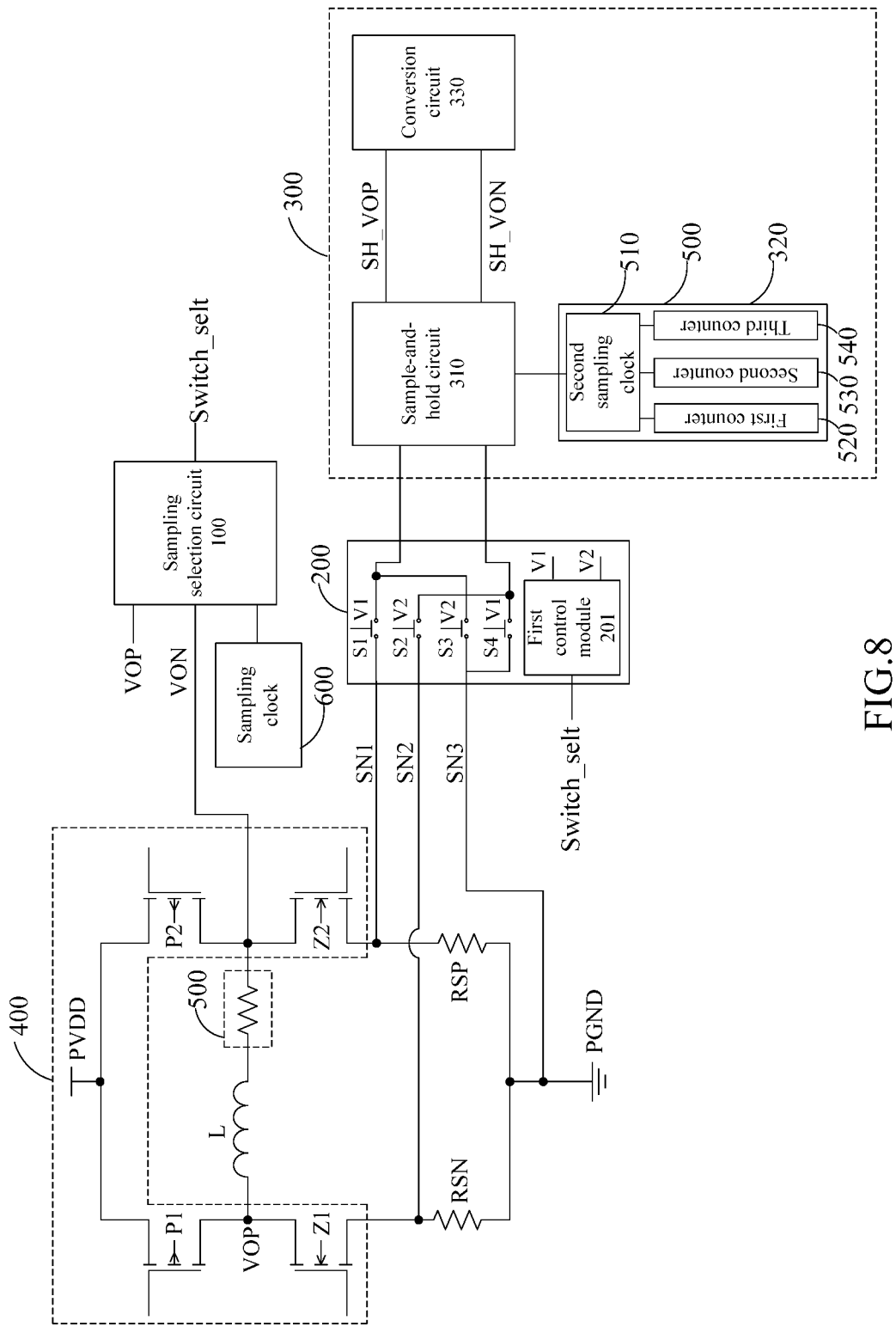
FIG. 8 is a schematic diagram of a current detection device according to an embodiment of the present disclosure.

In one embodiment as shown in FIG. 8, the dock control circuit 320 includes: a second sampling clock 510, a first counter 520, a second counter 530, and a third counter 540. An output end of the second sampling dock 510 is functioned as the output end of the clock control circuit 320, and is connected to a clock control end of the sample-and-hold circuit 310. A first input end of the second sampling dock 510 is connected to the first counter 520, a second input end of the second sampling clock 510 is connected to the second counter 530, and a third input end of the second sampling clock 510 is connected to the third counter 540.

The specific working principle is illustrated as follows.

If the potential difference between the output stage VOP and the output stage VON is within a positive half cycle, that is, the switching control signal Switch_selt is in a high level, the clock control signal outputted by the second sampling clock 510 is in a high level when the potential of the output stage VOP rises; and the first counter 520 is incremented by one, and the second counter 530 is incremented by one by utilizing the sampling clock 600.

When the potential of the output stage VOP drops, the first counter 520 is incremented by two and the second counter 530 is cleared. The first counter 520 repeats the above process until the first counter counts to 256 and the potential of the signal outputted by the second sampling clock 510 becomes low. If the second counter 530 has counted to 256, but the potential of the output stage VOP is still not dropped, the second counter 530 will control the potential of the clock control signal outputted by the second sampling clock 510 to become low, and the third counter 540 is incremented by one by utilizing the sampling clock 600.

When the potential of the output stage VOP rises again, the potential of the signal outputted by the second sampling clock 510 becomes high. If the potential of the output stage VOP still not rises when the third counter 540 has counted to 128, the third counter 540 controls the potential of the clock control signal outputted by the second sampling clock 510 to become high.

If the potential difference between the output stage VOP and the output stage VON is within a negative half cycle, that is, the switching control signal Switch_selt is in a low level, the clock control signal outputted by the second sampling clock 510 is in a high level when the potential of the output stage VOP rises; and the first counter 520 is incremented by one, and the second counter 530 is incremented by one by utilizing the sampling clock 600.

When the potential of the output stage VON drops, the first counter 520 is incremented by two and the second counter 530 is cleared. The first counter 520 repeats the above process until the first counter counts to 256 and the potential of the signal outputted by the second sampling clock 510 becomes low. If the second counter 530 has counted to 256, but the potential of the output stage VON is still not dropped, the second counter 530 will control the potential of the clock control signal outputted by the second sampling clock 510 to become low, and the third counter 540 is incremented by one by utilizing the sampling clock 600.

When the potential of the output stage VON rises again, the potential of the signal outputted by the second sampling clock 510 becomes high. If the potential of the output stage VON still not rises when the third counter 540 has counted to 128, the third counter 540 controls the potential of the clock control signal outputted by the second sampling clock 510 to become high.

The clock control circuit 320 repeats the above process until the potential of the switching control signal Switch_selt becomes high, that is, the working state of the class-D audio power amplifier 400 changes from a negative half period to a positive half period.

A specific embodiment of the clock control circuit is provided but is not limited by the present disclosure. A circuit structure or a chip composed of other discrete devices may be selected in practical applications, depending on a specific application environment, and any solution capable of implementing the aforementioned working principle is within the scope of the present disclosure.

The structure and principle of the clock control circuit in the embodiment are similar to those in the aforementioned embodiments, which will not be described again herein for simplicity.

Figure 9:
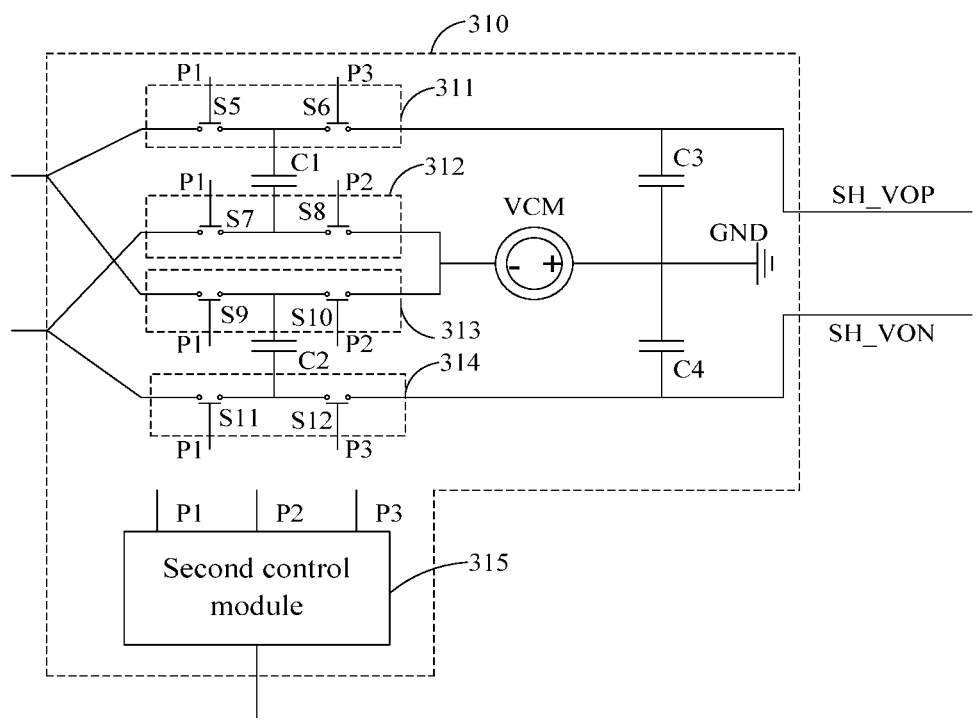
FIG. 9 is a schematic diagram of a sample-and-hold circuit of a current detection device according to an embodiment of the present disclosure.

In an embodiment, as shown in FIG. 9, the sample-and-hold circuit 310 includes: a first switching branch 311, a second switching branch 312, a third switching branch 313, a fourth switching branch 314, a voice coil motor VCM, a second control module 315, a first capacitor C1 and a second capacitor C2 having a same capacitance, and a third capacitor C3 and a fourth capacitor C4 having a same capacitance.

An input end of the first switching branch 311 is connected to an input end of the third switching branch 313, and a connection point of the input end of the first switching branch and the input end of the third switching branch is functioned as the first input end of the sample-and-hold circuit 310. An input end of the second switching branch 312 is connected to an input end of the fourth switching branch 314, and a connection point of the input end of the second switching branch and the input end of the third switching branch is functioned as the second input end of the sample-and-hold circuit 310.

A first output end of the first switching branch 311 is connected to one end of the third capacitor C3, and a connection point of the first output end of the first switching branch and the one end of the third capacitor is functioned as the first output end of the sample-and-hold circuit 310. A first output end of the fourth switching branch 314 is connected to one end of the fourth capacitor C4, and a connection point of the first output end of the fourth switching branch and the one end of the fourth capacitor is functioned as the second output end of the sample-and-hold circuit 310.

Another end of the third capacitor C3, another end of the fourth capacitor C4, and a positive end of the voice coil motor VCM are all connected to ground. A first output end of the second switching branch 312 is connected to a first output end of the third switching branch 313, and a connection point of the first output end of the second switching branch and the first output end of the third switching branch is connected to a negative end of the voice coil motor VCM.

One end of the first capacitor C1 is connected to a second output end of the first switching branch 311, and another end of the first capacitor C1 is connected to a second output end of the second switching branch 312. One end of the second capacitor C2 is connected to a second output end of the third switching branch 313, and another end of the second capacitor C2 is connected to a second output end of the fourth switching branch 314.

A first control end of the first switching branch 311, a first control end of the second switching branch 312, a first control end of the third switching branch 313, and a first control end of the fourth switching branch 314 are connected together, and then are connected to a first output end of the second control module 315.

A second control end of the second switching branch 312 is connected to a second control end of the third switching branch 313, and a connection point of the second control end of the second switching branch and the second control end of the third switching branch is connected to a second output end of the second control module 315. A second control end of the first switching branch 311 is connected to a second control end of the fourth switching branch 314, and a connection point of the second control end of the first switching branch and the second control end of the fourth switching branch is connected to a third output end of the second control module 315. An input end of the second control module 315 is functioned as the clock control end of the sample-and-hold circuit.

In one embodiment as shown in FIG. 9, the first switching branch 311 includes a fifth switch S5 and a sixth switch S6. An input end of the fifth switch. S5 is functioned as the input end of the first switching branch 311, an output end of the fifth switch S5 is connected to an input end of the sixth switch S6, a connection point of the output end of the fifth switch and the input end of the sixth switch is functioned as the second output end of the first switching branch 311, and an output end of the sixth switch S6 is functioned as the first output end of the first switching branch 311. A control end of the fifth switch S5 is functioned as the first control end of the first switching branch 311, and a control end of the sixth switch S6 is functioned as the second control end of the first switching branch 311.

In one embodiment as shown in FIG. 9, the second switching branch 312 includes a seventh switch S7 and an eighth switch S8. An input end of the seventh switch S7 is functioned as the input end of the second switching branch 312, an output end of the seventh switch S1 is connected to an input end of the eighth switch S8, a connection point of the output end of the seventh switch and the input end of the eighth switch is functioned as the second output end of the second switching branch 312, and an output end of the eighth switch S8 is functioned as the first output end of the second switching branch 312. A control end of the seventh switch S7 is functioned as the first control end of the second switching branch 312, and a control end of the eighth switch S5 is functioned as the second control end of the second switching branch 312.

In one embodiment as shown in FIG. 9, the third switching branch 313 includes a ninth switch S9 and a tenth switch S10. An input end of the ninth switch S8 is functioned as the input end of the third switching branch 313, an output end of the ninth switch S9 is connected to an input end of the tenth switch S10, a connection point of the output end of the ninth switch and the input end of the tenth switch is functioned as the second output end of the third switching branch 313, and an output end of the tenth switch 510 is functioned as the first output end of the third switching branch 313, a control end of the ninth switch S9 is functioned as the first control end of the third switching branch 313, and a control end of the tenth switch S10 is functioned as the second control end of the third switching branch 313.

In one embodiment as shown in FIG. 9, the fourth switching branch 314 includes an eleventh switch S11 and a twelfth switch S12. An input end of the eleventh switch S11 is functioned as the input end of the fourth switching branch 314, an output end of the eleventh switch S11 is connected to an input end of the twelfth switch S12, a connection point of the output end of the eleventh switch and the input end of the twelfth switch is functioned as the second output end of the fourth switching branch 314, and an output end of the twelfth switch S12 is functioned as the first output end of the fourth switching branch 314. A control end of the eleventh switch S11 is functioned as the first control end of the fourth switching branch 314, and a control end of the twelfth switch S12 is functioned as the second control end of the fourth switching branch 314.

The fifth switch S5, the sixth switch S6, the seventh switch S7, the eighth switch S8, the ninth switch S9, the tenth switch S10, the eleventh switch S11, and the twelfth switch S12 are turned on when a high level signal is received by the control end, and are turned off when a low level signal is received. Other embodiments that achieve the same purpose as this embodiment are within the scope of the present disclosure. The working principle of the sample-and-hold circuit 310 in this embodiment will be described hereinafter.

The working principle is illustrated as follows.

If the potential difference between the output stage VOP and the output stage VON is within a positive half cycle, that is, the switching control signal Switch_selt is in a high level, the first input end SN1 of the input selection circuit 200 is electrically connected with the first output end of the input selection circuit 200, and the third input end SN3 of the input selection circuit 200 is electrically connected with the second output end of the input selection circuit 200.

If the clock control signal outputted by the clock control circuit 320 is in a high level, a signal P1 outputted by the first output end of the second control module 315 is in a high level, the fifth switch S5, the seventh switch S7, the ninth switch S9 and the eleventh switch S11 are closed, and the first capacitor C1 and the second capacitor C2 start to sample a potential difference between the two ends of the first detection resistor RSP.

If the clock control signal outputted by the clock control circuit 320 becomes a low level signal, the signal P1 outputted by the first output end of the second control module 315 becomes a low level signal as well, thus the fifth switch S5, the seventh switch S7, the ninth switch S9 and the eleventh switch S11 are turned off, the value of Φ1 changes from high to low, and the first capacitor C1 and the second capacitor C2 stop sampling the potential difference between the two ends of the first detection resistor RSP.

A voltage value sampled by the first capacitor C1 is IL*RSP and a voltage value sampled by the second capacitor C2 is −IL*RSP; where IL is an operating current of the class-D audio power amplifier.

After the signal P1 outputted by the first output end of the second control module 315 becomes a low level signal, that is, the value of Φ1 becomes low, a signal P2 outputted by the second output end of the second control module 315 becomes a high level signal after a certain non-overlapping time, thus the eighth switch S8 and the tenth switch S10 are closed, the value of Φ2 changes from low to high, and a voltage is generated on the voice coil motor VCM. After the voltage has generated on the voice coil motor VCM, a signal outputted by the third output end of the second control module 315 becomes a high level signal in a certain period of time, thus the sixth switch S6 and the twelfth switch S12 are closed, the value of Φ3 changes from low to high, the voltages sampled by the first capacitor C1 and the second capacitor C2 are transferred to the third capacitor C3 and the fourth capacitor C4, and then are outputted to a conversion module 800.

A potential difference between the two output ends of the sample-and-hold circuit 310 is the difference between a potential SH_VOP at the first output end of the sample-and-hold circuit 310 and a potential SH_VON at the first output end of the sample-and-hold circuit 310, that is, SH_VOP−SH_VON=2*IL*RSP.

The voltage on the voice coil motor VCM is generated to make the voltage outputted by the first output end and the voltage outputted by the second output end of the sample-and-hold circuit 310 within a range of an input common mode voltage of the integrator-differential analog-to-digital converter.

If the clock control signal outputted by the clock control circuit 320 changes to a high level signal again, the signal P2 outputted by the second output end of the second control module 315 and a signal P3 outputted by the third output end of the second control module 315 become low level signals as well, thus the sixth switch S6, the eighth switch S8, the tenth switch S10 and the twelfth switch S12 are turned off, the values of Φ2 and Φ3 change from high to low. The signal P1 outputted by the first output end of the second control module 315 becomes a high level signal after a certain non-overlapping time, thus the fifth switch S5, the seventh switch S7, the ninth switch S9 and the eleventh switch S11 are closed, the value of Φ1 changes from low to high, and the first capacitor C1 and the second capacitor C2 start to sample the potential difference between the two ends of the first detection resistor RSP. The above process is repeated until the switching control signal Switch_selt becomes a low level signal, that is, the potential difference between the output stage VOP and the output stage VON is within a negative half cycle.

If the potential difference between the output stage VOP and the output stage VON is within a negative half cycle, that is, the switching control signal Switch_selt is in a low level, the third input end SN3 of the input selection circuit 200 is electrically connected with the first output end of the input selection circuit 200, and the second input end SN2 of the input selection circuit 200 is electrically connected with the second output end of the input selection circuit 200.

If the clock control signal outputted by the clock control circuit 320 is in a high level, the signal P1 outputted by the first output end of the second control module 315 is in a high level, the fifth switch S5, the seventh switch S7, the ninth switch S9 and the eleventh switch S11 are closed, and the first capacitor C1 and the second capacitor C2 start to sample a potential difference between the third input end and the second input end, that is, a potential difference between the two ends of the second detection resistor RSN. The remaining processes are similar to those described above and will not be described here again.

A specific embodiment of the sample-and-hold circuit is provided but is not limited by the present disclosure. A circuit structure or a chip composed of other discrete devices may be selected in practical applications, depending on a specific application environment, and any solution capable of implementing the aforementioned working principle is within the scope of the present disclosure.

The structure and principle of the sample-and-hold circuit in the embodiment are similar to those in the aforementioned embodiments, which will not be described again herein for simplicity.

The above embodiments in the specification are described in a progressive manner. Each of the embodiments is mainly focused on describing its differences from other embodiments, and references may be made among these embodiments with respect to the same or similar portions among these embodiments.

Based on the above description of the disclosed embodiments, those skilled in the art are capable of carrying out or using the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the broadest scope consistent with the principle and novel features disclosed herein.

The invention claimed is:

1. A current detection circuit for a loudspeaker, applied to a loudspeaker connected to a class-D audio power amplifier, comprising: a first detection resistor, a second detection resistor, a sampling selection circuit, an input selection circuit, and a processing circuit, wherein,
   one end of first detection resistor is connected to a first input end of the input selection circuit, a connection point of the one end of the first detection resistor and the first input end of the input selection circuit is functioned as a first input end of the current detection circuit for the loudspeaker, and the one end of the first detection resistor is connected to a source of a low-end NMOS transistor of an output stage VON of the class-D audio power amplifier;
   one end of the second detection resistor is connected to a second input end of the input selection circuit, a connection point of the one end of the second detection resistor and the second input end of the input selection circuit is functioned as a second input end of the current detection circuit for the loudspeaker, and one end of the second detection resistor is connected to a source of a low-end NMOS transistor of an output stage VOP of the class-D audio power amplifier;
   another end of the first detection resistor, another end the second resistor, and a third input end of the input selection circuit are all connected to ground;
   a first output end of the input selection circuit is connected to a first input end of the processing circuit, and a second output end of the input selection circuit is connected to a second input end of the processing circuit;
   an output end of the processing circuit is functioned as an output end of the current detection circuit for the loudspeaker;
   three input ends of the sampling selection circuit are connected to a sampling clock, the output stage VOP, and the output stage VON respectively;
   an output end of the sampling selection circuit is connected to a switch control end of input selection circuit; and
   the sampling selection circuit is configured to: control, when a potential difference between the output stage VOP and the output stage VON is in a positive half period, the first input end of the input selection circuit to be electrically connected with the first output end of the input selection circuit, and the third input end of the input selection circuit to be electrically connected with the second output end of the input selection circuit; and control, when the potential difference between the output stage VOP and the output stage VON is in a negative half period, the third input end of the input selection circuit to be electrically connected with the first output end of the input selection circuit, and the second input end of the input selection circuit to be electrically connected with the second output end of the input selection circuit.

2. The current detection circuit for a loudspeaker according to claim 1, wherein the input selection circuit comprises: a first switch, a second switch, a third switch, a fourth switch, and a first control module, wherein,
   a first end of the first switch is functioned as the first input end of the input selection circuit, a first end of the second switch is functioned as the second input end of the input selection circuit, a first end of the third switch is connected to a first end of the fourth switch, and a connection point of the first end of the third switch and the first end of the fourth switch is functioned as the third input end of the input selection circuit;
   a second end of the first switch is connected to a second end of the third switch, and a connection point of the second end of the first switch and the second end of the third switch is functioned as the first output end of the input selection circuit; a second end of the second switch is connected to a second end of the fourth switch, and a connection point of the second end of the second switch and the second end of the fourth switch is functioned as the second output end of the input selection circuit;
   a control end of the first switch is connected to a control end of the fourth switch, and a connection point of the control end of the first switch and the control end of the fourth switch is connected to a first output end of the first control module; a control end of the second switch is connected to a control end of the third switch, and a connection point of the control end of the second switch and the control end of the third switch is connected to a second output end of the first control module; and
   an input end of the first control module is functioned as the switch control end of the input selection circuit.

3. The current detection circuit for a loudspeaker according to claim 1, wherein the processing circuit is configured to: receive two signals outputted by the input selection circuit, sample and process a potential difference between the two signals outputted by the input selection circuit, and obtain a pulse density modulated, PDM, code.

4. The current detection circuit for a loudspeaker according to claim 1, wherein the processing circuit is configured to:
   sample and process a voltage between two ends of the first detection resistor, when the first input end of the input selection circuit is electrically connected with the first output end of the input selection circuit and the third input end of the input selection circuit is electrically connected with the second output end of the input selection circuit, to obtain a first pulse density modulated, PDM, code; and
   sample and process a voltage between two ends of the second detection resistor, when the third input end of the input selection circuit is electrically connected with the first output end of the input selection circuit and the second input end of the input selection circuit is electrically connected with the second output end of the input selection circuit, to obtain a second PDM code.

5. The current detection circuit for a loudspeaker according to claim 4, wherein the processing circuit comprises an active filter amplifier circuit and a conversion module, wherein,
- a first input end of the active filter amplifier circuit is functioned as the first input end of the processing circuit, and a second input end of the active filter amplifier circuit is functioned as the second input end of the processing circuit;
- a first output end of the active filter amplifier circuit is connected to a first input end of the conversion module, and a second output end of the active filter amplifier circuit is connected to a second input end of the conversion module; and
- an output end of the conversion module is functioned as the output end of the processing circuit.

6. The current detection circuit for a loudspeaker according to claim 5, wherein the active filter amplifier circuit comprises: an operational amplifier, a first input resistor, a second input resistor, a first filter branch, and a second filter branch, wherein,
- a first end of the operational amplifier is connected to an input end of the first filter branch, a connection point of the first end of the operational amplifier and the input end of the first filter branch is connected to one end of the first input resistor; another end of the first input resistor is functioned as the first input end of the active filter amplifier circuit;
- a second end of the operational amplifier is connected to an input end of the second filter branch, a connection point of the second end of the operational amplifier and the input end of the second filter branch is connected to one end of the second input resistor; another end of the second input resistor is functioned as the second input end of the active filter amplifier circuit;
- a third end of the operational amplifier is connected to an output end of the first filter branch, a connection point of the third end of the operational amplifier and the output end of the first filter branch is functioned as a first output end of the active filter amplifier circuit; and
- a fourth end of the operational amplifier is connected to an output end of the second filter branch, a connection point of the fourth end of the operational amplifier and the output end of the second filter branch is functioned as a second output end of the active filter amplifier circuit.

7. The current detection circuit for a loudspeaker according to claim 6, wherein,
- the first filter branch comprises a first capacitor and a first feedback resistor, the first capacitor is connected in parallel with the first feedback resistor, one end connected in parallel is functioned as the input end of the first filter branch, and another end connected in parallel is functioned as the output end of the first filter branch; and
- the second filter branch comprises a second capacitor and a second feedback resistor, the second capacitor is connected in parallel with the second feedback resistor, one end connected in parallel is functioned as the input end of the second filter branch, and another end connected in parallel is functioned as the output end of the second filter branch.

8. The current detection circuit for a loudspeaker according to claim 5, wherein the conversion module is an integro-differential analog-to-digital converter.

9. The current detection circuit for a loudspeaker according to claim 6, wherein the first input resistor and the second input resistor have a same resistance value.

10. The current detection circuit for a loudspeaker according to claim 4, wherein the processing circuit comprises: a sample-and-hold circuit, a clock control circuit, and a conversion circuit, wherein,
- a first input end of the sample-and-hold circuit is connected to the first output end of the input selection circuit, and a second input end of the sample-and-hold circuit is connected to the second output end of the input selection circuit;
- a first output end of the sample-and-hold circuit is connected to a first input end of the conversion circuit, a second output end of the sample-and-hold circuit is connected to a second input end of the conversion circuit, and a clock control end of the sample-and-hold circuit is connected to an output end of the clock control circuit; and
- an output end of the conversion circuit is functioned as the output end of the processing circuit.

11. The current detection circuit for a loudspeaker according to claim 10, wherein the sample-and-hold circuit is configured to: sample a potential difference between the two output ends of the input selection circuit according to a clock control signal outputted by the clock control circuit, or to stop sampling and output the potential difference to the conversion circuit; and
- the conversion circuit is configured to convert the potential difference, to obtain a PDM code.

12. The current detection circuit for a loudspeaker according to claim 10, wherein the sample-and-hold circuit is configured to: receive a clock control signal outputted by the clock control circuit, when the first input end of the input selection circuit is electrically connected with the first output end of the input selection circuit and the third input end of the input selection circuit is electrically connected with the second output end of the input selection circuit, sample a potential difference between the two ends of the first detection resistor in a case that the clock control signal received is in a high level, and stop sampling and output the potential difference to the conversion circuit in a case that the clock control signal received is in a low level; and
- the conversion circuit is configured to convert the potential difference, to obtain a first PDM code.

13. The current detection circuit for a loudspeaker according to claim 10, wherein the sample-and-hold circuit is configured to: receive a clock control signal outputted by the clock control circuit, when the third input end of the input selection circuit is electrically connected with the first output end of the input selection circuit and the second input end of the input selection circuit is electrically connected with the second output end of the input selection circuit, sample a potential difference between the two ends of the second detection resistor in a case that the clock control signal received is in a high level, and stop sampling and output the potential difference to the conversion circuit in a case that the clock control signal received is in a low level; and
- the conversion circuit is configured to convert the potential difference, to obtain a second PDM code.

14. The current detection circuit for a loudspeaker according to claim 12, wherein the sample-and-hold circuit comprises: a first switching branch, a second switching branch, a third switching branch, a fourth switching branch, a voice coil motor, a second control module, a first capacitor and a second capacitor having a same capacitance, and a third capacitor and a fourth capacitor having a same capacitance, wherein,
- an input end of the first switching branch is connected to an input end of the third switching branch, and a connection point of the input end of the first switching branch and the input end of the third switching branch is functioned as the first input end of the sample-and-hold circuit;
- an input end of the second switching branch is connected to an input end of the fourth switching branch, and a connection point of the input end of the second switching branch and the input end of the third switching branch is functioned as the second input end of the sample-and-hold circuit;
- a first output end of the first switching branch is connected to one end of the third capacitor, and a connection point of the first output end of the first switching branch and the one end of the third capacitor is functioned as the first output end of the sample-and-hold circuit;
- a first output end of the fourth switching branch is connected to one end of the fourth capacitor, and a connection point of the first output end of the fourth switching branch and the one end of the fourth capacitor is functioned as the second output end of the sample-and-hold circuit;
- another end of the third capacitor, another end of the fourth capacitor, and a positive end of the voice coil motor are all connected to ground;
- a first output end of the second switching branch is connected to a first output end of the third switching branch, and a connection point of the first output end of the second switching branch and the first output end of the third switching branch is connected to a negative end of the voice coil motor;
- one end of the first capacitor is connected to a second output end of the first switching branch, and another end of the first capacitor is connected to a second output end of the second switching branch;
- one end of the second capacitor is connected to a second output end of the third switching branch, and another end of the second capacitor is connected to a second output end of the fourth switching branch;
- a first control end of the first switching branch, a first control end of the second switching branch, a first control end of the third switching branch, and a first control end of the fourth switching branch are connected together, and then is connected to a first output end of the second control module;
- a second control end of the second switching branch is connected to a second control end of the third switching branch, and a connection point of the second control end of the second switching branch and the second control end of the third switching branch is connected to a second output end of the second control module;
- a second control end of the first switching branch is connected to a second control end of the fourth switching branch, and a connection point of the second control end of the first switching branch and the second control end of the fourth switching branch is connected to a third output end of the second control module; and
- an input end of the second control module is functioned as the clock control end of the sample-and-hold circuit.

15. The current detection circuit for a loudspeaker according to claim 14, wherein:
- the first switching branch comprises a fifth switch and a sixth switch, an input end of the fifth switch is functioned as the input end of the first switching branch, an output end of the fifth switch is connected to an input end of the sixth switch, a connection point of the output end of the fifth switch and the input end of the sixth switch is functioned as the second output end of the first switching branch, and an output end of the sixth switch is functioned as the first output end of the first switching branch, a control end of the fifth switch is functioned as the first control end of the first switching branch, and a control end of the sixth switch is functioned as the second control end of the first switching branch;
- the second switching branch comprises a seventh switch and an eighth switch, an input end of the seventh switch is functioned as the input end of the second switching branch, an output end of the seventh switch is connected to an input end of the eighth switch, a connection point of the output end of the seventh switch and the input end of the eighth switch is functioned as the second output end of the second switching branch, and an output end of the eighth switch is functioned as the first output end of the second switching branch, a control end of the seventh switch is functioned as the first control end of the second switching branch, and a control end of the eighth switch is functioned as the second control end of the second switching branch;
- the third switching branch comprises a ninth switch and a tenth switch, an input end of the ninth switch is functioned as the input end of the third switching branch, an output end of the ninth switch is connected to an input end of the tenth switch, a connection point of the output end of the ninth switch and the input end of the tenth switch is functioned as the second output end of the third switching branch, and an output end of the tenth switch is functioned as the first output end of the third switching branch, a control end of the ninth switch is functioned as the first control end of the third switching branch, and a control end of the tenth switch is functioned as the second control end of the third switching branch; and
- the fourth switching branch comprises an eleventh switch and a twelfth switch, an input end of the eleventh switch is functioned as the input end of the fourth switching branch, an output end of the eleventh switch is connected to an input end of the twelfth switch, a connection point of the output end of the eleventh switch and the input end of the twelfth switch is functioned as the second output end of the fourth switching branch, and an output end of the twelfth switch is functioned as the first output end of the fourth switching branch, a control end of the eleventh switch is functioned as the first control end of the fourth switching branch, and a control end of the twelfth switch is functioned as the second control end of the fourth switching branch.

16. The current detection circuit for a loudspeaker according to claim 12, wherein the clock control circuit comprises: a second sampling clock, a first counter, a second counter, and a third counter, wherein,
- an output end of the second sampling clock is functioned as the output end of the clock control circuit, a first input end of the second sampling clock is connected to the first counter, a second input end of the second sampling clock is connected to the second counter, and a third input end of the second sampling clock is connected to the third counter.

17. The current detection circuit for a loudspeaker according to claim 12, wherein the conversion circuit is an integro-differential analog-to-digital converter.

18. The current detection circuit for a loudspeaker according to claim 1, wherein the first detection resistor and the second detection resistor has a same resistance value.

19. The current detection circuit for a loudspeaker according to claim 1, wherein a frequency of the sampling clock is 256 times a pulse width modulation frequency of a potential of the output stage VOP and a potential of the output stage VON.

20. The current detection circuit for a loudspeaker according to claim 1, further comprising a cascaded integrator-comb, CIC, filter, wherein the CIC filter is configured to: convert a signal outputted by the processing circuit, to obtain a sampled voltage value, and calculate a current value on the loudspeaker based on the sampled voltage value.

* * * * *